Figure 1:
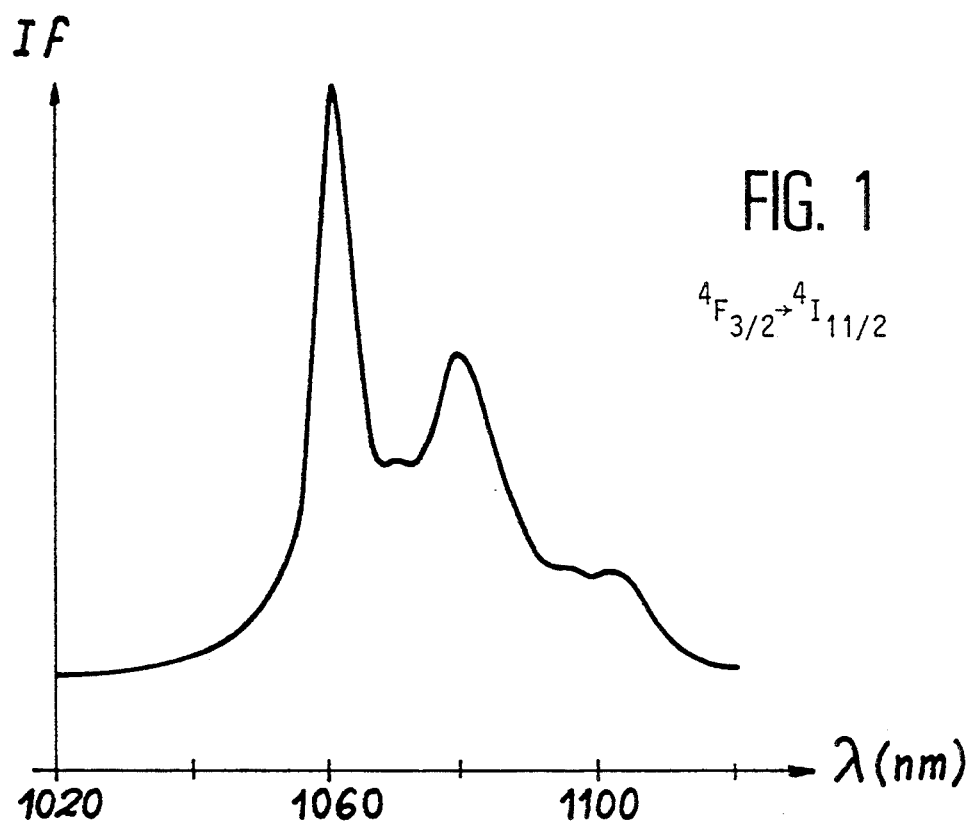

United States Patent [19]
Lejus et al.

[11] Patent Number: 5,416,789
[45] Date of Patent: May 16, 1995

[54] NEODYMIUM-DOPED GEHLENITE CRYSTAL AND LASER USING SAID CRYSTAL

[76] Inventors: Anne-Marie Lejus, 70 Avenue Aristide Briand, 92120 Montrouge; Daniel Vivien, 6 bis Rue de Kronstadt, 92380 Garches; Robert Collongues, 7, rue de Fontenay, 92360 Bourg la Reine, all of France; Driss Saber, Université Hassan II, Fac des Sciences Ain Chok, BP5366 Maarif Casa, Morocco; Jean-Marie Benitez, 567 rue de la Gare-Arbonne la Forêt, 77630 Barbizon, France

[21] Appl. No.: 984,434
[22] PCT Filed: Jul. 3, 1992
[86] PCT No.: PCT/FR92/00632
§ 371 Date: Mar. 22, 1993
§ 102(e) Date: Mar. 22, 1993
[87] PCT Pub. No.: WO93/01139
PCT Pub. Date: Jan. 21, 1993

[30] Foreign Application Priority Data
Jul. 4, 1991 [FR] France ............. 91 08395

[51] Int. Cl.[6] ........................ H01S 3/16
[52] U.S. Cl. ............... 372/41; 252/301.4 R
[58] Field of Search .......... 372/41, 69, 71, 72; 252/301.4 R

[56] References Cited
U.S. PATENT DOCUMENTS
4,820,445  4/1989  Piekarczyk et al. ......... 252/301.4 R

OTHER PUBLICATIONS

Finch et al; Czochralski Growth and Characterization of Single-Crystal Akelmante ($Ca_2MgSi_2O_7$): Jour. Crystal Growth 23 (1974) pp. 295–298.
Finch et al.; Czochralski Growth of Single-Crystal Gehenite ($Ca_2AlSiO_7$); Jour. Crystal Growth 54, (1981) pp. 482–484.
Kaminskii et al; "Crystal Structure, Absorption, Luminescence Properties, and Stimulated Emission of Ga Gehlenite"; Phys. Stat. Sol(A) vol. 82, No. 297, 1986.
J. Crystal Growth, vol. 54, No. 3, Sep. 1981, Amsterdam, NL pp. 482–484, C. B. Finch et al. "Czochralski Growth of Single-Crystal Gehenite (Ca2Al2SiO7)" (see p. 482).
J. Crystal Growth, vol. 23, 1974, Amsterdam, NL, pp. 295–298, C. B. Finch et al., "Czochralski Growth of Single Crystal Akermanaite (Ca2 Mg2Si2O7)" (see p. 297).
Phys. Stat. Sol.(A), vol. 97, No. 297, 1986, Berlin, Allemagne, pp. 279–290, A. A. Kaminski et al., "Crystal Structure, Absorption, Luminescence Properties and Stimulated Emission of Ga Gehlenite".

Primary Examiner—Léon Scott, Jr.

[57] ABSTRACT

Neodymium-doped gehlenite crystal and laser using said crystal. The crystal according to the invention has the formula $Ca_{2-x}Nd_xAl_{2+x}Si_{1-x}O_7$ with $0 < X \leq 1$. This crystal can be used as a laser emitter (4) optically pumped by a laser diode (6), whose temperature is not controlled by a Peltier element component.

13 Claims, 4 Drawing Sheets $^4F_{3/2} \rightarrow {}^4I_{11/2}$ $^4F_{3/2} \rightarrow {}^4I_{13/2}$

NEODYMIUM-DOPED GEHLENITE CRYSTAL AND LASER USING SAID CRYSTAL

DESCRIPTION

The present invention relates to crystals and more particularly to neodymium-doped gehlenite monocrystals. It can be used either in the field of microlasers for integrated optics, optical fibre telecommunications, medicine (microsurgery, skin treatment) and research on semiconductors, or in the field of power lasers making it possible to carry out material treatments (welding, perforating, marking, surface treatment), photochemical reactions, controlled thermonuclear fusion or the polarization of the atoms of a gas such as helium. These lasers emit in the infrared between 870 and 1130 nm. More particularly, the invention applies to lasers optically pumped by a laser diode and which can be wavelength tuned between 1050 and 1100 nm.

The most frequently used, commercial solid power lasers make use of a garnet of yttrium and aluminium $Y_3Al_5O_{12}$ (YAG), doped by $Nd^{3+}$. However, this material suffers from disadvantages. Thus, it has a crystallogenesis at a high temperature of 1900° to 2000° C., which makes it difficult and expensive, a segregation of the dopant, narrow absorption bands, etc. Therefore research has been carried out with a view to finding new matrixes and this has also been made necessary by the ever improving performance characteristics required for new lasers, namely very high efficiency, miniaturization, emission at various wavelengths, etc.

Numerous matrixes which can be doped by $Nd^{3+}$ have been proposed in the literature. Among these matrixes, reference can be made to compounds such as melilite $ALaGa_3O_7$, gehlenite $AGa_2SiO_7$ and akermanite $A MGe_2O$, in which A represents the $Ca^{2+}$, $Sr^{2+2}$ or $Ba^{2+}$ ions and M represents $Be^{2+}$, $Mg^{2+}$ or $Zn^{2+}$ ions.

Compared with doped aluminium and yttrium garnet, these compounds have the major advantage of being producible by the Czochralski method, which is the most widely used in the laser industry and at temperatures roughly 500° C. lower. In addition, there is no segregation of the luminescent dopant.

Under flash lamp optical pumping, a certain number of these compounds have the laser effect.

The document A. Keminskii et al. Phys. Star. Sol. (a), 97, 1986, pp 279–290, "Crystal structure, absorption, luminescence, properties, and stimulated emission of Ga gehlenite" describes the stimulated emission in a $Ca_2Ga_2SiO_7$ monocrystal doped with neodymium ions.

The article by W. Ryba-Romanowski et al., J. Phys. Chem. Solids, 50, 1989, pp 685–692 "Relaxation of the $^3F_{3/2}$ level of $Nd^{3+}$ in $BaLa_{1-x}Nd_xGa_3O_7$" describes the laser emission of a monocrystal of $BaLa_{1-x}Nd_xGa_3O_7$ with $0 \leq X \leq 0.2$.

The article by D. J. Horowitz et al, J. Appl. Phys., vol. 43, No. 8, August 1972, "Laser action of $Nd^{3+}$ in a crystal $Ba_2ZnGe_2O_7$, pp 3527–3529 describes the laser effect of a $Ba_2ZnGe_2O_7$ crystal doped with neodymium with a quantity of 2 mole %.

The article by M. Alan et al., J. Appl. Phys. 39, 1968, "Optical spectra and laser action of neodymium in a crystal $Ba_2MgGe_2O_7$", pp 4728–4730 describes the laser effect of a crystal of $Ba_2MgGe_2O_7$ doped with neodymium with approximately 2 mole %.

All these compounds have the advantage of a uniaxial quadratic structure, whereas the YAG crystal is cubic, so that a polarized emission can be obtained.

Unfortunately, all these compounds suffer from the disadvantage of containing a large amount of gallium, which is expensive. Moreover, it is unstable in oxidation state $3+$ at high temperature, as a function of the working conditions and with the possibility of volatilization. Moreover, due to the volatilization of the gallium, the crystals obtained by Czochralski growth have inadequate quality characteristics when it is a question of obtaining the large dimensions required by the power laser industry.

Moreover, these compounds have a thermal conductivity making it difficult to dissipate the heat during their use as a laser emitter in a power laser.

In the field of microlasers, the miniaturization of solid lasers passes through the use of laser diodes for optical pumping having much smaller dimensions than those of flash lamps. In addition, laser diodes have a high reliability and laser efficiency levels well above those of flash lamps (10 times higher). This high laser efficiency requires a perfect coincidence between the diode emission line and the absorption band maximum relative to the monocrystal.

Due to the wavelength drift of the diode emission during the power rise resulting from the heating of the diode, it is necessary to use a diode temperature control system with a view to compensating said wavelength drift. The diode temperature control is generally brought about by a Peltier element. Unfortunately, the latter has a high electric power consumption, which in part destroys the interest of the high diode pumping efficiency.

Only a crystal having wide and intense absorption bands in the diode emission range making it possible to cover the wavelength drift thereof would make it possible to get round said Peltier element.

Thus, very recently, a melilite $SrGdGa_3O_7$ doped with 2 atomic % by $Nd^{3+}$ ions has been proposed for diode pumping (cf. in this connection the document by H. R. Verdun et al, Tunable Solid State Lasers IV, 1990, pp 405–407, "Growth and characterization of Nd doped aluminates and galates with the melilite structure").

This material has the advantage of a wide line from approximately 10 nm to 810 nm corresponding to the emission wavelength of the generally used laser diodes. However, up to now stimulated emission has not been obtained with this compound. Moreover, like the preceding compounds, it contains a large amount of gallium.

The invention also relates to a novel, gallium-free material, which can be optically pumped by a laser diode without using a Peltier element for the temperature control thereof.

As a gallium-free material able to replace YAG and not suffering from the disadvantages of crystallogenesis and segregation of the activating dopant, lanthanum-neodymium-magnesium aluminates (LNA) are known having the chemical formula $La_{1-x}Nd_xMgAl_{11}O_{19}$ with $0 < X \leq 1$ and in particular with $x = 0.1$.

These aluminates form the subject matter of patents FR-A-2 448 134 and EP-A-43 776 and the publication by L. D. Schearer et al, IEEE Journal of Quantum Electronics, vol. QE-22, No. 5, May 1986, pp 713–717 "LNA: a new CW Nd laser tunable around 1.05 and 1.08 um". The monocrystals of these aluminates have optical properties comparable to those of neodymium-doped YAG.

However, here again the production of these aluminates in the form of large monocrystals by the Czochralski method along the optical axis which would be of an optimum nature for the laser properties causes problems and leads to crystals having an inadequate quality when required in sizes such as are needed for power lasers.

In the field of microlasers, LNA can be optically pumped by a laser diode, provided that a diode temperature control Peltier element is used, as for YAG.

Therefore the invention relates to a neodymium-doped gehlenite crystal, usable as a laser emitter and making it possible to obviate the disadvantages referred to hereinbefore.

In particular, this compound can be produced in monocrystalline form with large sizes and which suffers from neither bubbles nor defects and using the Czochralski method. Therefore this gehlenite monocrystal can be used in the power laser industry.

It can also be used in the field of microlasers with pumping by diode and without using a Peltier element. Its energy efficiency and costs are consequently well below those of known crystal monolasers.

More specifically, the invention relates to a neodymium-doped gehlenite crystal of formula $Ca_{2-x}Nd_xAl_{2+x}Si_{1-x}O_7$ with $0 < X \leq 1$.

The crystallogenesis of this crystal according to the Czochralski method is well controlled and can take place without there being any risk of volatilization of the constituents. It is performed at temperatures below those used for YAG (approximately 1600° C.) and there is no segregation of the neodymium dopant. The melting of this compound is congruent, which gives the possibility of producing large crystals usable as a laser emitter in a power laser.

Compared with its gallium homolog ($Ca_2Ga_2SiO_7$:Nd), the crystal according to the invention has a better chemical inertia and a greater hardness, so that it has an improved mechanical strength. It contains aluminium and not gallium, so that the cost is lower. Moreover, it must have a higher thermal conductivity than that of the gallium homolog. Thus, in the expression of the thermal conductivity $K = C.v.l$, C is the heat capacity per volume unit and increases if the molecular mass decreases, v represents the velocity of the phonons in the crystal and l is the free average path of the phonons.

Crystallographically, the lattice of the gehlenite according to the invention is smaller than that of the gallium homologs, which leads to modifications of the crystal field and therefore to the optical properties.

In particular, the crystallographic structure is more disturbed than that of $BaLaGa O_7$:Nd. Thus, in the latter the site of $Nd^{3+3}$ is only surrounded by $Ga^{3+}$ ions, whereas in $Ca_2Al_2SiO_7$:Nd, said seine site is surrounded both by $Al^{3+}$ and $Si^{4+}$ ions.

This disorder can be accentuated by carrying out substitutions on the three types of cationic sites.

The compound according to the invention is intended to be used as a laser emitter emitting in the infrared, both in power lasers and in microlasers.

The invention also relates to a laser having a laser cavity containing as the light emitter a monocrystal, means for emplifying the light from the monocrystal, means for extracting the light from the laser cavity and pumping means, characterized in that the monocrystal is a neodymium-doped gehlenite of formula $Ca_{2-x}Nd_xAl_{2+x}Si_{1-x}O_7$ with $0 < X \leq 1$.

In particular, x is such that $0 < X \leq 0.3$. Advantageously, x is such that $0.01 \leq X \leq 0.2$ and preferably 0.025 to 0.05 and preferably x is 0.04.

The disorder of the structure leads to a widening of the emission bands. The transition $^4F_{3/2} \rightarrow ^4I_{11/2}$, which is the cause of the main laser emission, has an important contribution from 1.05 μm to 1.10 μm, which is remarkable if it is considered that for YAG the laser wavelength is 1.064 μm. Thus, the laser emission can be tuned as in LNA.

Thus, the crystal according to the invention has a wide wavelength tunability range and at present it is the widest range which exists for neodymium-doped laser crystals, with the exception of glasses.

The life of the excited state is approximately 280 μs for x=0.02, for x=0.1 it is approximately 160 μs and for x=0.2 30 μs, which is a high value for such a doping level.

The major interest of the material according to the invention for the envisaged laser application is that it is suitable for pumping by laser diode. Thus, the optical absorption spectrum of $Nd^{3+}$ in this compound has the same configuration of those of other $Nd^{3+}$ activated laser matrixes, but with the special feature here that it is the band towards 800 nm ($^4I_{9/2} \rightarrow ^4F_{5/2}, ^2H_{9/2}$) which is the most intense, whereas in most other cases, it is the hypersensitive transition to 580 nm which is the most intense. This result is particularly remarkable, because this wavelength (800 nm) exactly corresponds to the emission range of laser diodes.

In addition, this absorption band is very wide as a result of the disorder between $Ca^{2+}$ and $Nd^{3+}$ and between $Al^{3+}$ and $Si^{4+}$ and covers the complete diode emission range. Moreover, even if there is wavelength drift in the latter case, the absorption will still be adequate.

The $Nd^{3+}$ sites have a very low symmetry (Cs), which aids a high intensity of the absorption bands.

The values of the oscillator strength calculated for a refractive index n=1.77 are particularly high and the highest (7.35.10$^{-6}$) corresponds to the transition $^4I_{9/2} \rightarrow ^4F_{5/2}, ^2H_{9/2}$ at 800 nm.

Figure 2:
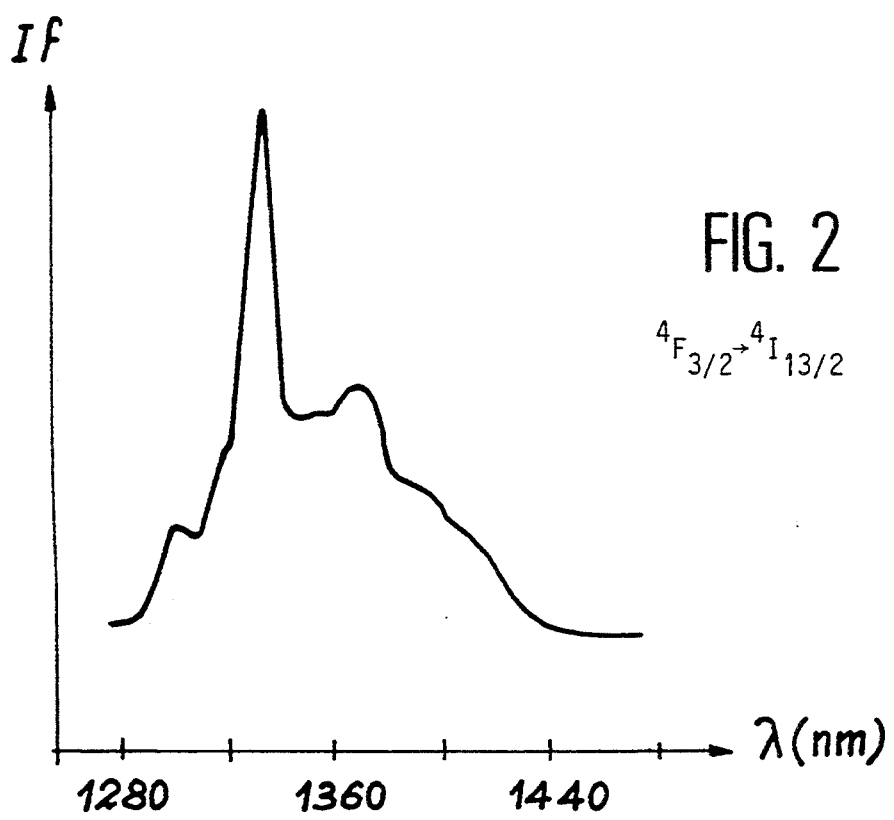

Other features and advantages of the invention can be gathered from the following non-limitative description and with reference to the attached drawings, wherein show:

FIGS. 1 & 2 Diagrammatically the fluorescence spectrum at 300K of a gehlenite crystal according to the invention.

Figure 3:
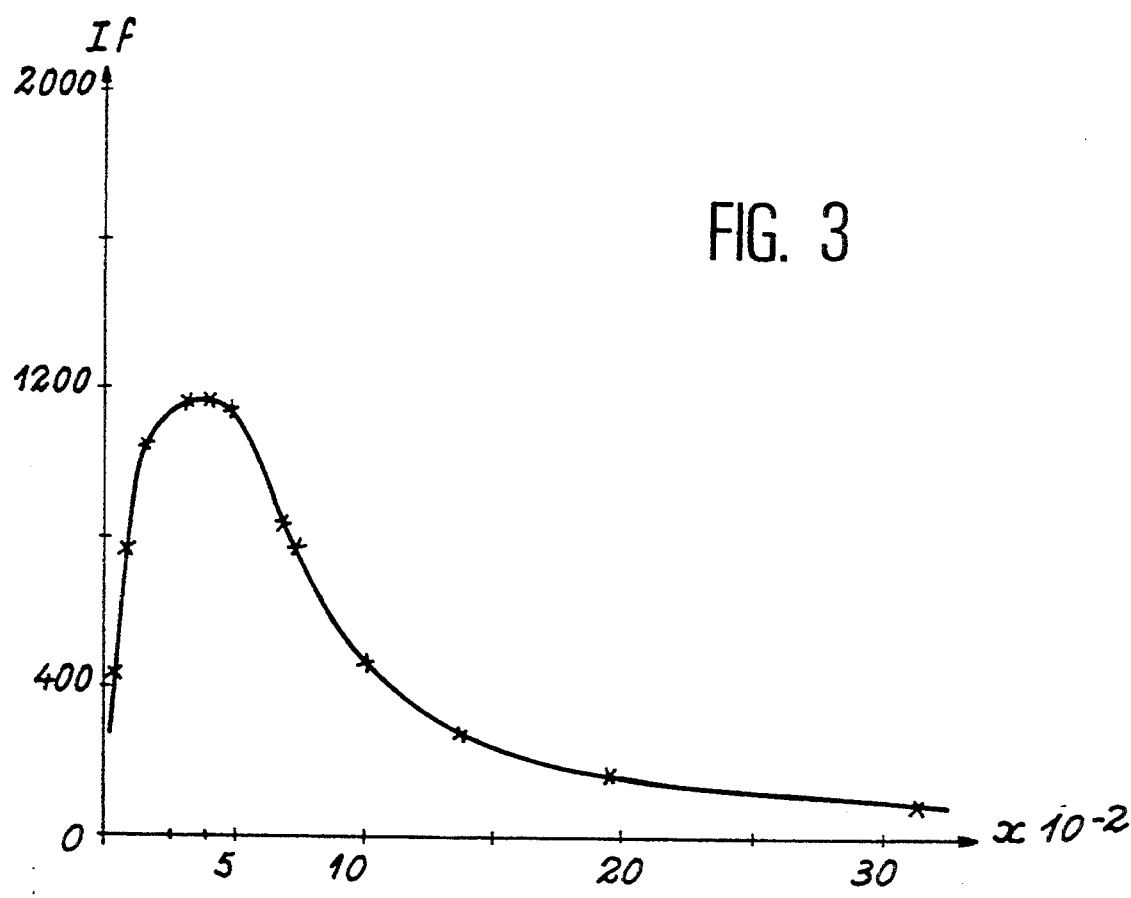

FIG. 3 The fluorescence intensity variations as a function of the neodymium content.

Figure 4:
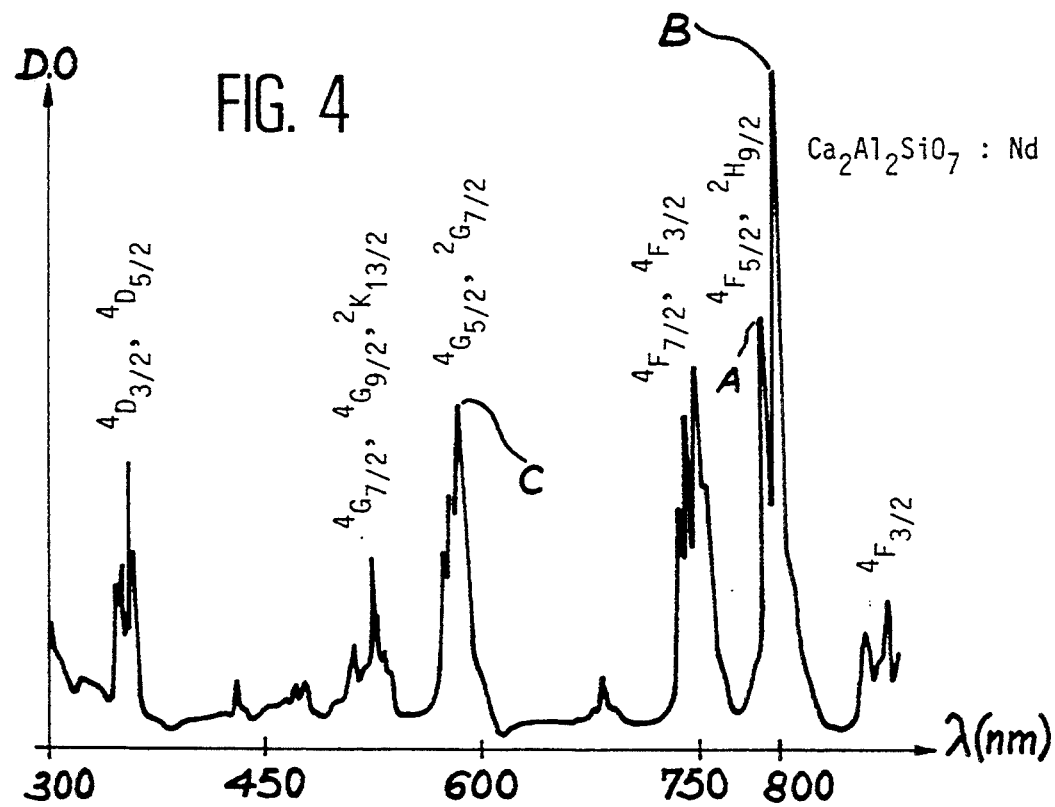

FIG. 4 Part of the absorption spectrum of a crystal according to the invention.

Figure 5:
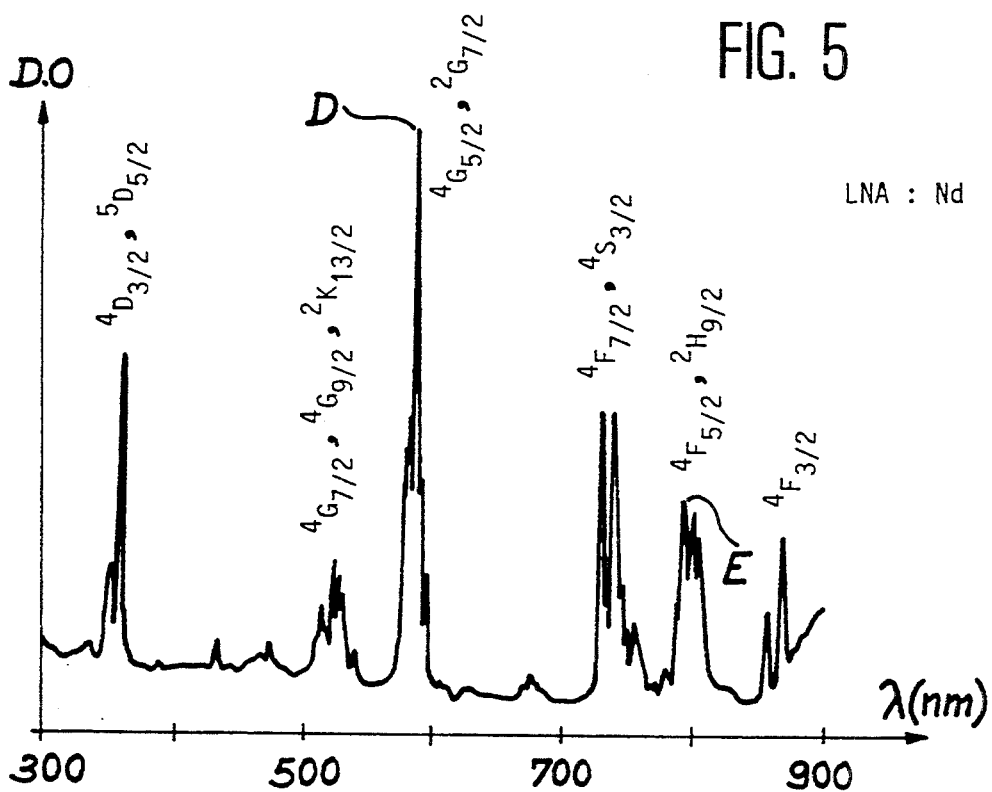

FIG. 5 For comparison, part of the absorption spectrum of a neodymium-doped LNA monocrystal.

Figure 6:
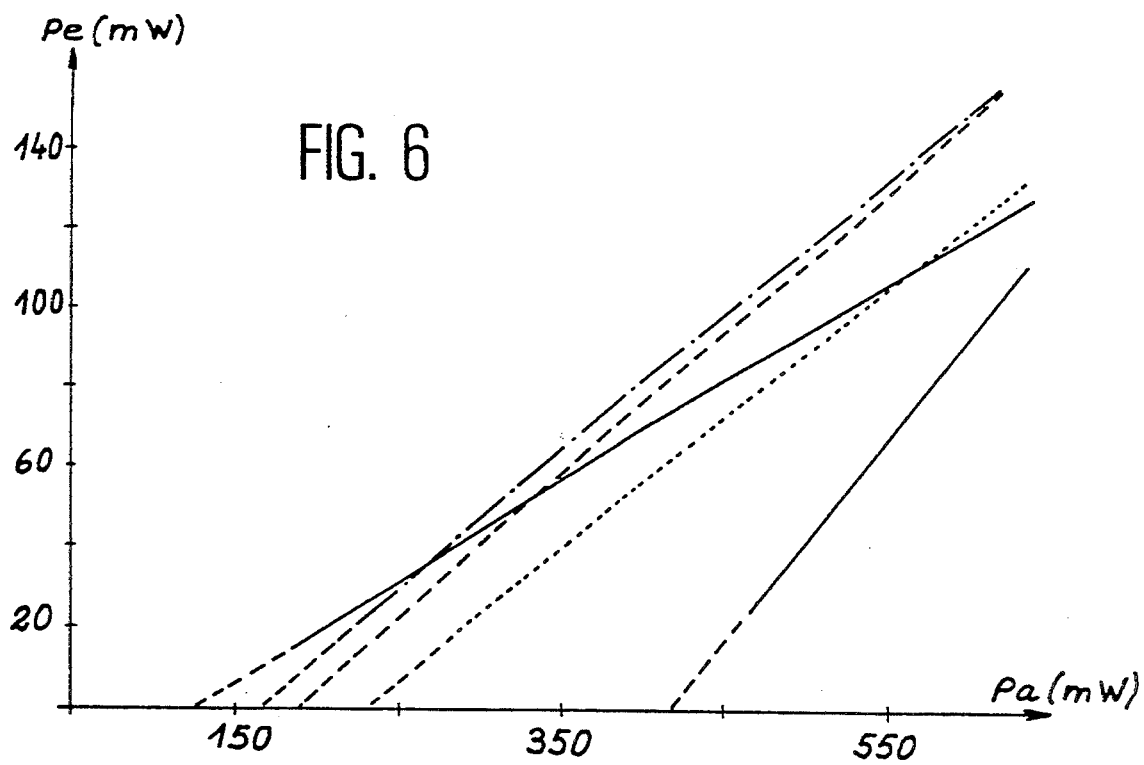

FIG. 6 The laser power emitted as a function of the pumping power for a gehlenite crystal with x=0.02.

Figure 7:
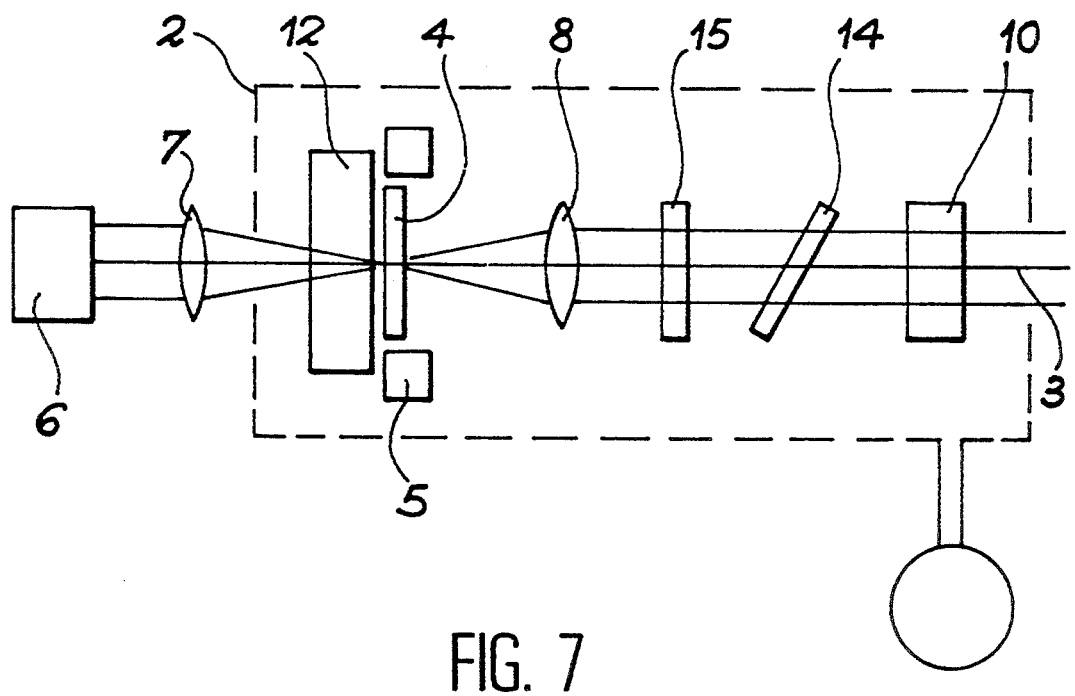

FIG. 7 Diagrammatically a power laser according to the invention, optically pumped by a laser diode.

In order to produce a neodymium-doped gehlenite crystal of formula (I):

(I) $Ca_{2-x}Nd_xAl_{2+x}Si_{1-x}O_7$, use is made of commercially available high purity powders of calcium carbonate, neodymium and aluminium oxides, as well as silica, which are weighed out in the desired proportions. These powders are mixed for several hours with a mechanical stirrer and are then compressed into the shape of a cylinder. Fritting takes place for 20 hours at 1450° C. to obtain doped calcium aluminosilicate for forming the molten bath.

The starting products used are in the form of a powder with a grain size of 1 to 10 μm and have a purity better than 99.99%, in order to obtain a maximum efficiency for the laser emission.

The fritted mixture is then placed in an iridium crucible and brought to a temperature of 1600° C. corresponding to the melting point of the mixture. Pulling takes place under an argon or nitrogen atmosphere from a nucleus having the desired orientation. Generally, pulling takes place along axis c of the crystal. The pulling rate varies from 0.5 to 1 mm per hour and the rotation speed is approximately 40 r.p.m.

Obviously, it would also be possible to use any other crystallogenesis method employing a molten bath such as the Bridgmann method, the floating zone method, the Kyropoulos method or the auto-crucible method.

A perfectly monocrystalline sample can be isolated from the crystal obtained according to the Czochralski method by cleaving or cutting and polishing, so as to obtain two strictly parallel faces. This sample can then be placed in a laser cavity like that shown in FIG. 5 and can be optically pumped by a laser diode emitting at approximately 800 nm.

FIGS. 1 and 2 diagrammatically show the variations of the fluorescence intensity $I_f$ (in arbitrary units) as a function of the wavelength in nanometres, at 300K for a gehlenite according to the invention. FIG. 1 relates to the optical transmission $^4F_{3/2} \rightarrow {}^4I_{11/2}$ which is the most interesting from the laser standpoint and FIG. 2 corresponds to the transition $^4F_{3/2} \rightarrow {}^4I_{13/2}$, the latter being of interest for optical fibre information transmission.

These curves show that the laser emission takes place on a broad band of 1050 to 1100 nm for the transition $^4F_{3/2} \rightarrow {}^4I_{11/2}$ and 1300 to 1430 nm for the transition $^4F_{3/2} \rightarrow {}^4I_{13/2}$.

Thus, the crystals according to the invention have a wide wavelength tunability and a laser emission with a greater wavelength than that of most neodymium-doped laser crystals. In particular, neodymium-doped LNA emits at 1054, 1083 and 1320 nm with a wavelength tunability of a few nm (below 10 nm) and neodymium-doped YAG emits at 1064 nm with a tunability below 0.6 nm.

These fluorescence spectra were obtained using an exciting wavelength of 577 nm, corresponding to the transition $^4I_{9/2} \rightarrow {}^4G_{5/2}, {}^2G_{7/2}$ in absorption of the crystal, and a composition x in neodymium of 0.02. However, it should be noted that the general configuration of this spectrum is applicable no matter what the neodymium quantity and only the absorption intensity may differ slightly.

Although this is not apparent from the curves, the crystal according to the invention also emits between 870 and 930 nm, which corresponds to the transition $^4F_{3/2} \rightarrow {}^4I_{9/2}$.

The following table I gives the life of the excited state $^4F_{3/2}$ as a function of the $Nd^{3+}$ ion quantity for four of the gehlenite crystals according to the invention. In this table, x indicates the $Nd^{3+}$ ion quantity, the two central columns give the short and long life of the laser effect and the last column gives the fluorescence intensity in arbitrary units. These values were established for a 1 mm thick crystal.

Table I shows that the life decrease and the fluorescence intensity drop for x=0.20 is linked with the auto-extinction phenomenon. Above x=0.30, the life and fluorescence intensity are inadequate for using said compound as a laser emitter. Compound No. 2 is that having the best laser properties.

FIG. 3 gives the fluorescence intensity variations If (in arbitrary units) as a function of the doping rate x in neodymium in crystals of formula (I). The curve of FIG. 3 was experimentally determined and clearly shows that the intensity maximum is x<0.05, particularly 0.025 to 0.05 and more especially at x=0.04.

FIG. 4 shows the absorption spectrum of a gehlenite crystal according to the invention and FIG. 5 the absorption spectrum of a neodymium-doped LNA crystal. These curves give the optical densities (O.D.) as a function of the wavelength in nanometres. These drawings reveal the absorption transitions.

FIG. 4 shows that the absorption spectrum of the $Nd^{3+}$ doped gehlenite according to the invention has an intense, wide absorption band around 800 nm. The peaks A and B respectively correspond to absorption wavelengths of 797.1 and 806.7 nm. The laser diodes emit in said wavelength range.

The crystals according to the invention also have an absorption band at 590 nm (hypersensitive range), peak C of the absorption curve, like most neodymium-doped materials, but unlike in the case of other neodymium-doped compounds, said absorption band is much less intense than that around 800 nm. This is particularly illustrated by FIG. 5, where the absorption maximum is around 580 nm, peak D of the absorption curve, whereas the absorption intensity around 800 nm, peak E of curve 4, is much weaker than that at 580 nm.

For information purposes, the following table II gives the oscillator strengths of the absorption transitions. These oscillator strengths are among the highest observed for known neodymium-doped compounds.

As a result of the wide absorption band around 800 to 805 nm and the high absorption intensity, it is not necessary to use a diode temperature control system like that using the Peltier effect. Thus, optical pumping can be ensured between 790 and 820 nm and thus covers the wavelength drift of the diode. In addition, the crystals according to the invention are very suitable for laser diode optical pumping.

FIG. 6 gives the variations of the laser emission power in mW as a function of the pumping power in mW of a gehlenite crystal of composition $Ca_{1.98}Nd_{0.02}Al_{2.02}Si_{0.98}O_7$. These experimentally established curves prove that the crystals according to the invention do have the laser effect.

These results, given in qualitative manner, show that the tested crystal corresponding to x=0.02 leads to a differential efficiency of approximately 40%. However, this crystal was not optimized. Thus, its crystalline quality was mediocre and its doping level did not correspond to the optimum $Nd^{3+}$ content determined on the curve of FIG. 3.

Therefore there is no doubt that with a crystal having a better crystalline quality and with a content x of $Nd^{3+}$ between 0.03 and 0.05, that the laser efficiency of the material would increase considerably.

FIG. 7 diagrammatically shows a continuously operating power laser using as the laser emitter a crystal according to the invention. This laser comprises a laser cavity 2 containing a bar 4 of compound No. 2 placed perpendicularly to the laser longitudinal axis 3, the axis c of the bar coinciding with the laser axis 3. Laser emission is in the infrared (cf. FIG. 4).

A monochromatic light source 6, such as a laser diode or an array of laser diodes, makes it possible to irradiate the gehlenite bar 4, via a convergent lens 7, in order to ensure the optical pumping thereof. A device 5 for the circulation of distilled water around the bar 4 ensures the cooling thereof. However, there is no diode temperature control.

For a high laser efficiency, it is preferable for the electrical field of the pumping light emitted by the diode to be perpendicular to the crystal axis c.

The laser cavity 2 is formed by a convergent lens 8 transforming the light emitted by the gehlenite bar 4 into a parallel light beam, which is supplied to an outlet mirror 10. After reflection on the latter, the light beam again passes through the convergent lens 8 and the amplifying medium or bar 4. The amplified laser beam is then reflected by a dichroic entrance mirror 12 in the vicinity of which is positioned the bar 4. This mirror 12 is transparent to the light emitted by the monochromatic source 6 and opaque to that emitted by the gehlenite monocrystal 4.

The laser beam which has been adequately amplified in the cavity 2 is then passed to the outside of the laser cavity, via the mirror 10, which is partly transparent to the light emitted by the gehlenite monocrystal 4.

The wavelength tunability can be obtained with the aid of a wavelength selection system 14 placed between the convergent lens 8 and the outlet mirror 10 of the laser cavity 2, of the Brewster angle prism or Lyot filter type formed from several birefringent material plates.

In addition, a solid etalon 15 of the type formed by a plate having parallel faces can be inserted between the convergent lens 8 and the Lyot filter 14 to fix the emission wavelength.

The diode 6 has the advantage of being very small, considerably reducing the overall dimensions of the crystal laser and it emits at a wavelength of approximately 800 nm. The absorption spectrum of FIG. 3 reveals a wide, intense absorption band around 800 to 805 nm.

The laser diodes have an excellent efficiency of approximately 50% and the laser conversion is approximately 30 to 40%, which corresponds to a laser effect efficiency of at least 20% from the electric current.

The monocrystals according to the invention can be used in all applications presently using a YAG laser emitter. In particular, these monocrystals can be used in lasers used in the cutting or marking of materials, as well as for making welds.

In addition to applications of the YAG type, these oxides have special applications. They are particularly suitable for pumping by laser diodes and therefore to the production of miniaturized devices (military applications, scientific research, medical applications). In addition, their special emission wavelengths and the tunability thereof can be advantageously used in optical telecommunications or for the polarization of certain atoms by optical pumping.

TABLE I

| Ex. | x | Short life μs | Long life μs | Fluorescent intensity arbitrary units |
|---|---|---|---|---|
| 1 | 0.02 | — | 275 | 101 |
| 2 | 0.04 | 238 | 284 | 213 |
| 3 | 0.10 | 142 | 190 | 307 |
| 4 | 0.20 | — | 30 | 276 | x represents the quantity of neodymium ions.

TABLE II

| Transition* | Oscillator strengths | Wavelength (nm) |
|---|---|---|
| $^4F_{5/2}, ^2H_{9/2}$ | $7.35 \times 10^{-6}$ | 800 |
| $^4F_{7/2}, ^4S_{3/2}$ | $6.80 \times 10^{-6}$ | 750 |
| $^4F_{9/2}$ | $0.47 \times 10^{-6}$ | 700 |
| $^2G_{7/2}, ^4G_{5/2}$ | $6.29 \times 10^{-6}$ | 590 (hypersensitive) |
| $^4G_{7/2}, ^2G_{9/2}, ^2K_{13/2}$ | $4.31 \times 10^{-6}$ | 530 |
| $^4G_{9/2}, ^2D_{3/2}, ^4G_{11/2}, ^2K_{15/2}$ | $1.94 \times 10^{-6}$ | 480 |
| $^2P_{1/2}$ | $0.2 \times 10^{-6}$ | 400 |
| $^4D_{5/2}, ^4D_{3/2}$ | $7.78 \times 10^{-6}$ | 360 |

*From the base level $^4I_{9/2}$ of the $Nd^{3+}$ ions.

We claim:

1. A neodymium-doped gehlenite crystal of formula $Ca_{2-x}Nd_xAl_{2-x}Si_{1-x}O_7$ with $0 < X \leq 3$, whereby said crystal has a chemical inertia and hardness, so that it has an improved mechanical strength, and whereby said crystal has an improved thermal conductivity.

2. A crystal according to claim 1, characterized in that x is chosen so that $0.01 \leq X \leq 0.2$.

3. A crystal according to claim 1, characterized in that x is chosen so that $0.025 \leq X \leq 0.05$.

4. A crystal according to claim 1, characterized in that x is 0.04.

5. Laser essentially having a laser cavity (2) containing as the light emitter a monocrystal (4), means (10, 12) for amplifying the light from the monocrystal, means (10) for extracting the light from the laser cavity and pumping means (6, 7), characterized in that the monocrystal is a neodymium-doped gehlenite of formula $Ca_{2-x}Nd_xAl_{2+x}Si_{1-x}O_7$ with $0 < X \leq 1$.

6. A laser according to claim 5, wavelength tunable in the infrared, characterized in that it incorporates means for tuning (14).

7. A laser according to claim 5, characterized in that the pumping means are constituted by at least one laser diode.

8. A laser according to claim 7, characterized in that the laser diode emits at approximately 800 to 805 nm.

9. A laser according to any one of the claims 5 to 8, characterized in that x is chosen so that $0 < X \leq 0.3$.

10. A laser according to any one of the claims 5 to 8, characterized in that x is chosen so that $0.01 \leq X \leq 0.2$.

11. A laser according to claim 5, characterized in that x is chosen so that $0.025 \leq X \leq 0.05$.

12. Laser according to claim 5, characterized in that x is 0.04.

13. A crystal according to claim 1, characterized in that x is chosen so that $0 < X \leq 0.3$.

* * * * *